(12) United States Patent
Gage et al.

(10) Patent No.: US 6,976,183 B2
(45) Date of Patent: Dec. 13, 2005

(54) CLOCK ARCHITECTURE FOR A FREQUENCY-BASED TESTER

(75) Inventors: Robert Bruce Gage, Beaverton, OR (US); Peter Reichert, Thousand Oaks, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/008,967

(22) Filed: Nov. 9, 2001

(65) Prior Publication Data

US 2004/0205432 A1    Oct. 14, 2004

(51) Int. Cl.[7] .......................... H04L 7/00; H03K 19/094
(52) U.S. Cl. ...................... 713/500; 375/371; 375/376; 375/356; 375/327; 375/105; 375/156
(58) Field of Search ........................ 713/500; 375/371, 375/376, 356; 327/105, 156

(56) References Cited

U.S. PATENT DOCUMENTS

| | | | |
|---|---|---|---|
| 5,153,883 A | 10/1992 | Hayashi et al. | |
| 5,481,573 A * | 1/1996 | Jacobowitz et al. | ........ 375/356 |
| 5,710,517 A | 1/1998 | Meyer | |
| 5,712,883 A | 1/1998 | Miller et al. | |
| 5,917,834 A | 6/1999 | Arkin | |
| 5,935,256 A | 8/1999 | Lesmeister | |
| 6,028,439 A | 2/2000 | Arkin et al. | |
| 6,111,712 A * | 8/2000 | Vishakhadatta et al. | ...... 360/51 |
| 6,121,816 A | 9/2000 | Tonks et al. | |
| 6,130,552 A | 10/2000 | Jefferson et al. | |
| 6,188,253 B1 * | 2/2001 | Gage et al. | .................. 327/105 |
| 6,208,702 B1 | 3/2001 | Ghoshal | |
| 6,281,727 B1 * | 8/2001 | Hattori | ........................ 327/156 |
| 6,621,882 B2 * | 9/2003 | Denny et al. | ................ 375/371 |
| 6,643,791 B1 * | 11/2003 | Teodorescu | .................. 713/500 |
| 6,693,987 B1 * | 2/2004 | Hattori | ........................ 375/376 |

OTHER PUBLICATIONS

L. Ashby, Asic Clock Distribution Using a Phase Locked Loop (PLL), Sep. 1991, pp. P1-6.1-6.3, IEEE, New York, NY.

* cited by examiner

Primary Examiner—A. Elamin
(74) Attorney, Agent, or Firm—Teradyne Legal Department

(57) ABSTRACT

A clock system is disclosed for distributing and generating a digital clock signal for a plurality of electronic assemblies. The clock system includes a remote fixed-frequency clock for generating a first clock signal of a first frequency and a plurality of local clock modules. The local clock modules are respectively disposed on the plurality of electronic assemblies and each include synthesizer circuitry for creating a variable clock signal of a different frequency than the first frequency. Fanout circuitry is coupled between the remote fixed frequency clock and the plurality of local clock modules to distribute the first clock signal.

18 Claims, 4 Drawing Sheets though the analog clock is described in U.S. Pat. No. 6,188,253, entitled Analog Clock Module, assigned to the assignee of the present invention, and expressly incorporated herein by reference.

CLOCK ARCHITECTURE FOR A FREQUENCY-BASED TESTER

FIELD OF THE INVENTION

The invention relates generally to automatic test equipment and more particularly a clock architecture for distributing a digital clock signal throughout a semiconductor tester with high accuracy and low jitter.

BACKGROUND OF THE INVENTION

Logic circuits implemented on an integrated circuit are typically synchronized by distributing a master clock signal to each timing critical circuit. The transfer of data in a clocked system, such as a microprocessor, is generally controlled by a master clock. The successful operation of a microprocessor, in large part, relies on the accuracy and performance of the master clock.

When testing semiconductor devices, the master clock is often provided by the automatic test equipment (ATE), which drives precisely timed signals to, and compares signals from, the pins of the device to test for acceptable device operation. The ATE master clock also provides a reference for the ATE timing circuitry to ensure that data signals from the ATE arrive at the DUT pins in a synchronized manner within acceptable limits.

While the microprocessor under test is but one device, the ATE to test it has duplicate electronic circuit resources, or channels, associated with each device pin. Thus, for each pin of the microprocessor being tested, there may be several integrated circuits employed for the ATE timing circuitry, pattern generation circuitry, waveform formatting circuitry, and so forth. Distributing a master clock to each of the ATE integrated circuits is no small problem.

With microprocessor operating frequencies surpassing one gigahertz, distributing the master clock within the ATE circuitry, and minimizing loss of accuracy has proved problematic. Additionally, modern microprocessors often employ circuitry responsive to data signals of varying frequencies.

One approach to distributing a high-speed and high-accuracy clock within a tester is to create the clock centrally. An expensive, highly accurate hardware module could be created or purchased to provide such a clock. Unfortunately, distribution of such a clock is problematic due to skew and jitter effects for each re-powering, and control problems with amplitude and skew. Moreover, a centralized single clock system fails to address the unique problems associated with devices having different pins receiving and transmitting different frequency signals.

A similar approach to the centrally created clocking scheme described above is employed in the Catalyst mixed-signal semiconductor test system, manufactured by Teradyne, Inc., in Boston, Mass. The scheme is shown generally in FIG. 1, and includes a digital master clock 8 distributed, or fanned out, to a plurality of digital and analog channel cards 10 and 12. Signals generated by a centralized pattern generator 14 are also fanned out with the digital master clock to the channel cards. The clock signals for the digital cards are fed to timing circuitry 16, which drives waveform formatting circuitry 18 to produce digital signals for application to the device-under-test (DUT, not shown). The analog cards 12, on the other hand, receive the remotely generated digital master clock signal, and synthesize it through an analog clock module (ACM) 19, to produce a local analog sinusoidal waveform $A_0$ used to drive one or more analog instruments. One form of the analog clock is described in U.S. Pat. No. 6,188,253, entitled Analog Clock Module, assigned to the assignee of the present invention, and expressly incorporated herein by reference.

While this scheme is beneficial for its intended applications, the practical limitation to the fanning-out of the digital master clock to the digital boards is around 500 Mhz. At higher clock frequencies, jitter becomes more pronounced, degrading the accuracy of the tester. This problem is less pronounced for the analog boards because the analog clock is created locally on the board.

Therefore, a need exists in the art for an inexpensive clock architecture that distributes a digital clock signal with high accuracy throughout a tester to generate a high-frequency digital clock for the digital channel cards. The clock architecture of the present invention satisfies this need.

SUMMARY OF THE INVENTION

The clock architecture of the present invention provides a low-cost way to accurately provide a high-speed digital clock for a semiconductor tester.

To realize the foregoing advantages, the invention in one form comprises a clock system for distributing and generating a digital clock signal for a plurality of electronic assemblies. The clock system includes a remote fixed-frequency clock for generating a first clock signal of a first frequency and a plurality of local clock modules. The local clock modules are respectively disposed on the plurality of electronic assemblies and each include synthesizer circuitry for creating a variable clock signal of a different frequency than the first frequency. Fanout circuitry is coupled between the remote fixed frequency clock and the plurality of local clock modules to distribute the first clock signal.

In another form, the invention comprises a frequency-based semiconductor tester including a computer workstation and a testhead. The testhead has remote fixed-frequency clocking circuitry for creating a high-accuracy clock signal of a first frequency. The testhead further includes a plurality of channel cards, each of the channel cards including synthesizer circuitry for creating a local frequency-based variable clock signal of a different frequency than the first frequency. Fanout circuitry is disposed between the channel card synthesizer circuitry and the fixed frequency clocking circuitry for distributing the clock signal as a reference signal for the synthesizer circuitry.

In yet another form, the invention comprises a method of clocking a plurality of electronic assemblies. The method includes the steps of remotely establishing a fixed clock signal of a first frequency; fanning-out the fixed clock signal to the plurality of electronic assemblies; and using the fixed clock signal on the plurality of electronic assemblies to locally synthesize a higher frequency clock signal for each of the electronic assemblies.

A further form of the invention comprises a method of starting a plurality of ATE pattern generators synchronously, the pattern generators disposed on respective channel cards. The method includes the steps of creating a remote fixed-frequency clock; generating a control sync signal, the sync signal associated with a predetermined edge of the fixed-frequency clock; fanning out the fixed-frequency clock and the sync signal to a plurality of clock modules residing on the respective channel cards, the clock modules including clock synthesizer circuitry and edge prediction logic; locally synthesizing a variable-frequency clock on each of the channel cards with the respective clock module synthesizer circuitry, the variable frequency clock of a different frequency than the fixed-frequency clock; and passing the sync signal with the edge prediction circuitry through the first clock domain to the second variable-frequency clock domain to identify an accurate and common start time for the plurality of pattern generators.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Clocking schemes play an important role in achieving high-accuracy testing of integrated circuits. Another important factor involves cost. Balancing low cost with high accuracy is a desirable goal, but often difficult to attain. The present invention satisfies this goal by distributing a remotely generated low-frequency (but highly accurate) reference clock signal to a plurality of local channel cards, and synthesizing a localized high-frequency clock signal from the remote reference clock. This substantially minimizes jitter.

Figure 1:
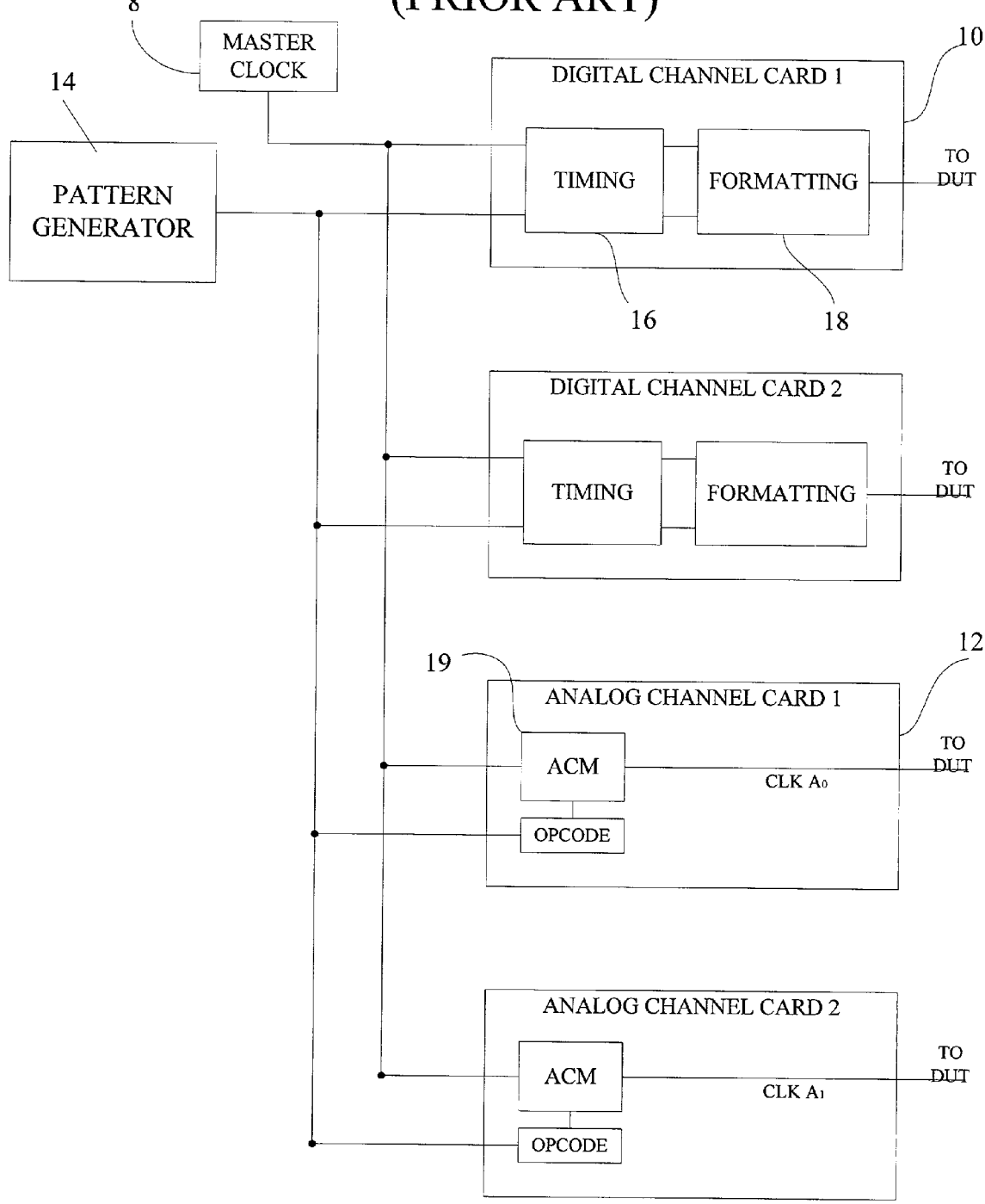
FIG. 1 is a block diagram of a conventional clock architecture for a semiconductor tester.
Figure 2:
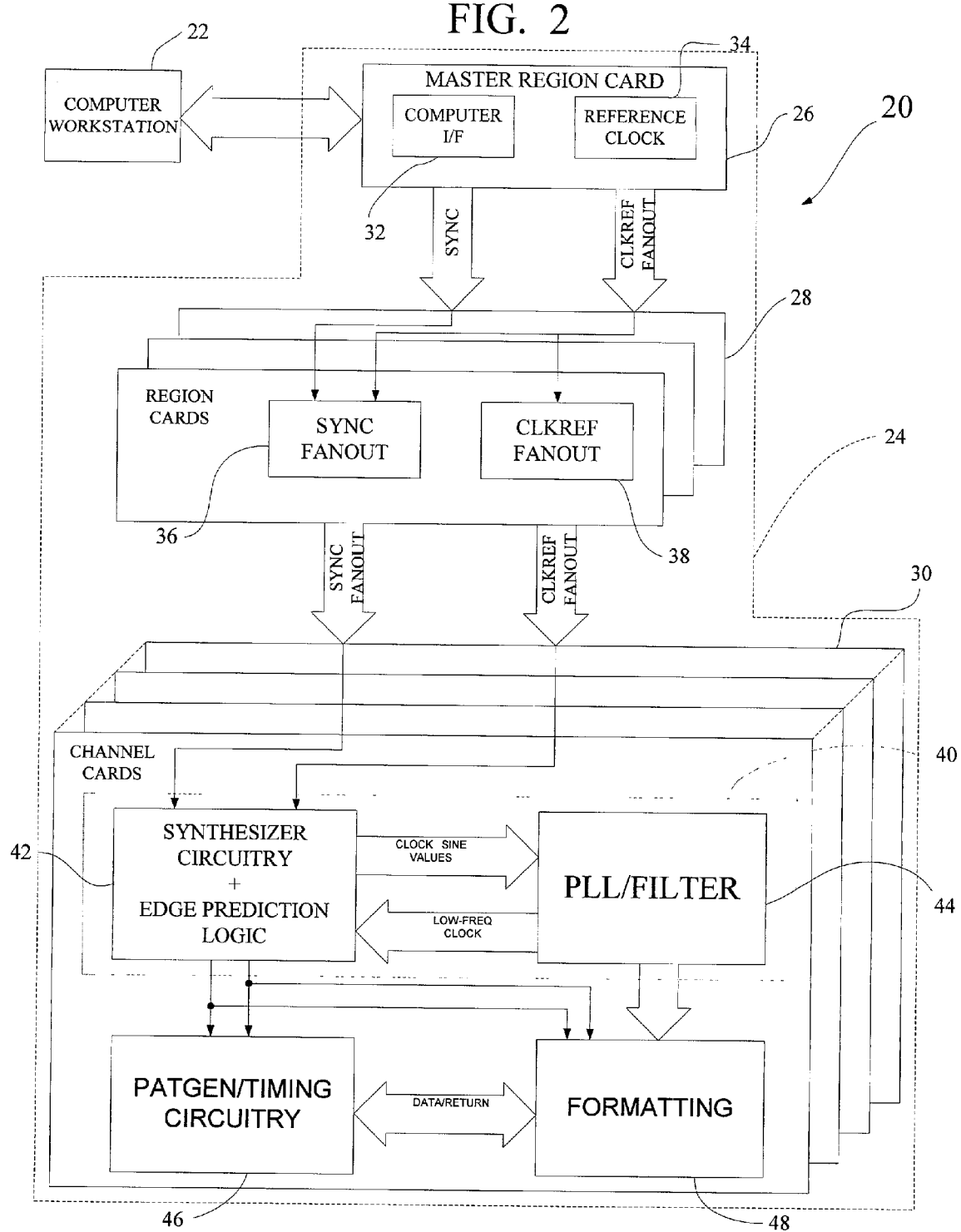
FIG. 2 is a block diagram of a clock architecture according to one form of the present invention.

Referring more specifically to FIG. 2, the clocking architecture of the present invention resides in a semiconductor tester, generally designated 20, which includes a computer workstation 22, and a testhead 24 (in phantom). The testhead houses a plurality of electronic board assemblies for generating tester signals including a master region card 26, region cards 28, and channel cards 30.

As illustrated in FIG. 2, the master region card 26 feeds signals to multiple region cards 28, each region card controlling an array of channel cards 30. The master region card includes a computer interface 32 that ties the workstation 22 to the testhead board assemblies, and a reference clock 34. The reference clock establishes a "fixed frequency", and preferably comprises a 125 Mhz crystal oscillator. The interface 32 includes control circuitry that generates control signals responsive to commands from the workstation. One of the control signals comprises a "sync" signal, which is one cycle wide, and programmed on command to coincide with a reference edge from the reference clock.

The reference clock signal and the sync signal are fanned-out, or distributed, along sync and clock fanout circuitry 36 and 38 disposed on the region cards 28 and at the master region card/region card interface, and the region card/channel card interface. As alluded to above, each region card is associated with several channel cards 30. One embodiment includes up to sixteen channel cards per region card, with each channel card employing electronic resources for multiple tester channels.

Further referring to FIG. 2, each channel card 30 includes a clock module 40 (in phantom) comprising synthesizer circuitry 42 and PLL/filter circuitry 44. The clock module is similar in construction to the analog clock module described in U.S. Pat. No. 6,188,253, previously incorporated by reference herein.

Each channel card 30 also includes pattern generation and timing circuitry 46, and formatting circuitry 48. The clock module, patgen/timing, and formatting circuits are preferably realized using application specific integrated circuits (ASICs). The formatting ASICs include clock input ports for a clock which operates over the range of 1 gigahertz to 2 gigahertz, conveniently and accurately provided as a locally synthesized variable-frequency clock by the clock module. Additionally, the clocking architecture allows for the generation of several other clocks, as needed by the various ASICs on each channel card.

In operation, the reference clock 34 generates an extremely accurate 125 Mhz clock that is fanned-out along the fanout circuitry 38 to the individual channel cards 30. Because the reference clock signal is of a relatively low frequency, jitter effects due to fanout are minimized.

The reference clock is received by each channel card clock module 40, and synthesized according to the direct-digital-synthesis technique more fully described in U.S. Pat. No. 6,188,253. Generally, though, the reference clock signal increments a 48-bit accumulator, which then feeds a phase-locked-loop to generate a sinusoidal re-creation of the reference clock. Divider circuitry (not shown) divides the frequency of the signal to create varying clocks for the different ASICs, including the master oscillator clock signal of between 1 to 2 gigahertz. The filtering circuitry 44 formats the clock waveform to make it more suitable for the pattern generation/timing clock inputs.

Since the recreated clock signal is produced locally on each channel card 30, jitter effects related to transmission path lengths are minimized. Additionally, by implementing the clock module 40, albeit in a digital context, an inexpensive reference clock may be employed for the initial clock distribution.

Figure 3:
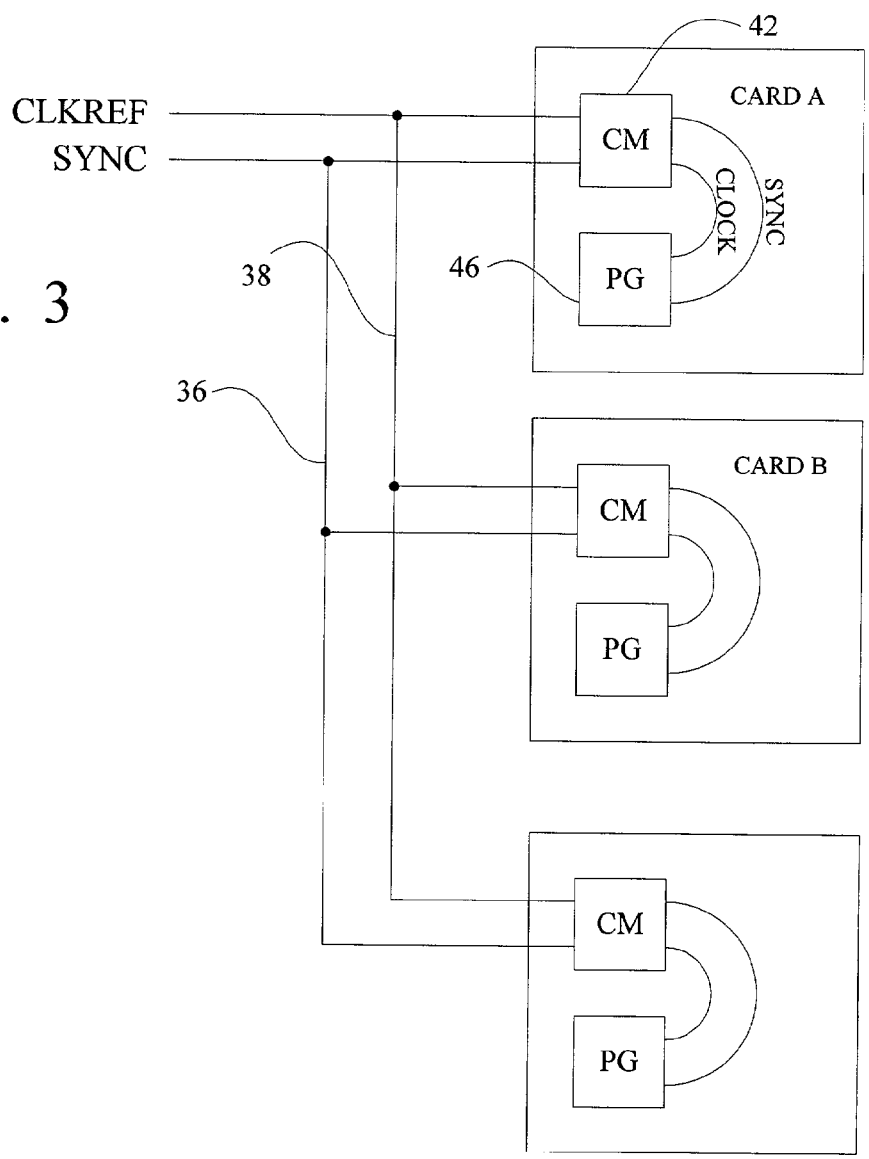
FIG. 3 is a simplified block diagram of the clock architecture of FIG. 2.
Figure 4:
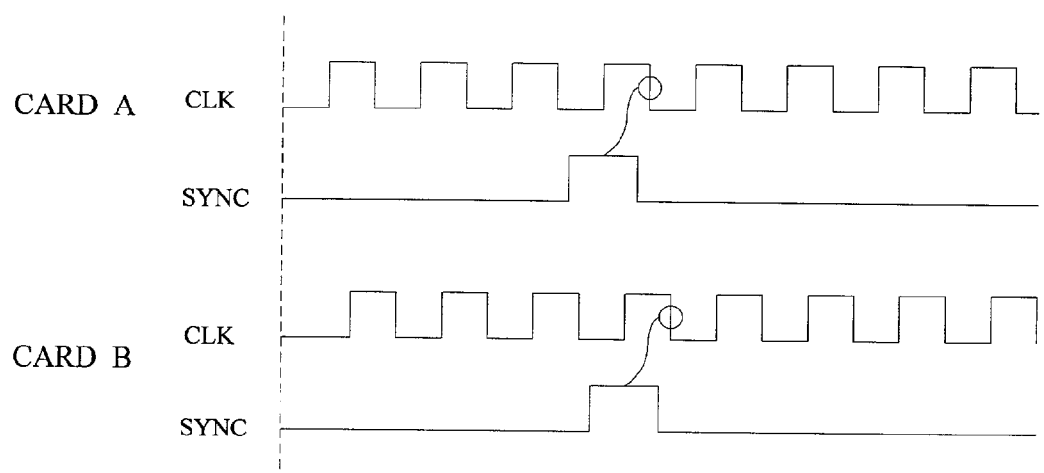
FIG. 4 is a timing diagram illustrating the sync signal and clock signal interrelationship.

In most applications, semiconductor manufacturers often require starting all of the ATE pattern generators synchronously. This is accomplished through the use of the sync signal. FIG. 3 shows a simplified block diagram of the architecture of FIG. 2 to understand this concept more clearly. As described earlier, the sync signal is associated with a predetermined reference edge of the reference clock, shown in FIG. 4. By knowing where each of the reference edges lie in the respective "re-created" gigahertz clock domains, delays may be programmed for each variable clock to realize a synchronous multi-patgen start.

Detecting the relative timing of the reference edge is accomplished by employing the prediction circuitry available in the clock module. As described in U.S. Pat. No. 6,188,253, the prediction logic is used for analog clock applications to predict edge alignments between analog clock and digital clock domains, thereby enabling control and command "opcode" signals to be safely "tossed" from the digital to analog domains.

Here, the inventors have discovered that this same "opcode tossing" technique may be advantageously employed to reliably pass the sync signal from the fixed-frequency clock domain to the variable-frequency clock domain. Once the sync signals are tossed, and relative phase offsets determined and calibrated-out, synchronous start is achievable.

Figure 5:
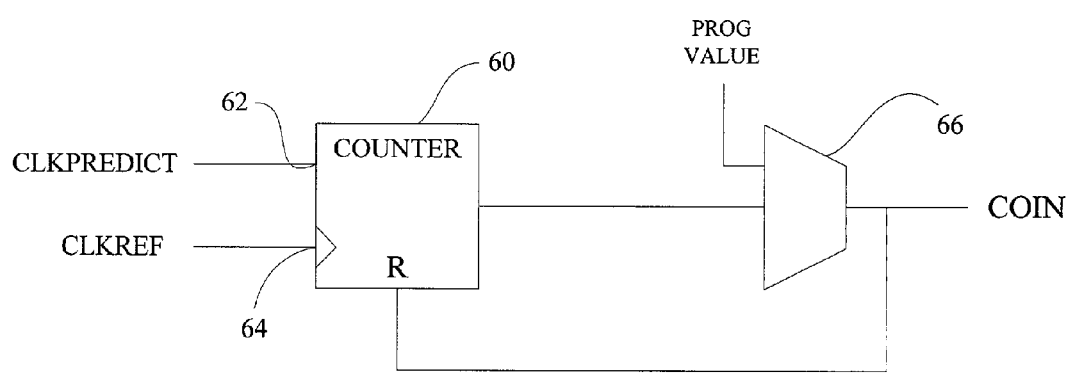
FIG. 5 is a block diagram of a counter circuit for detecting coincidence points.
Figure 6:
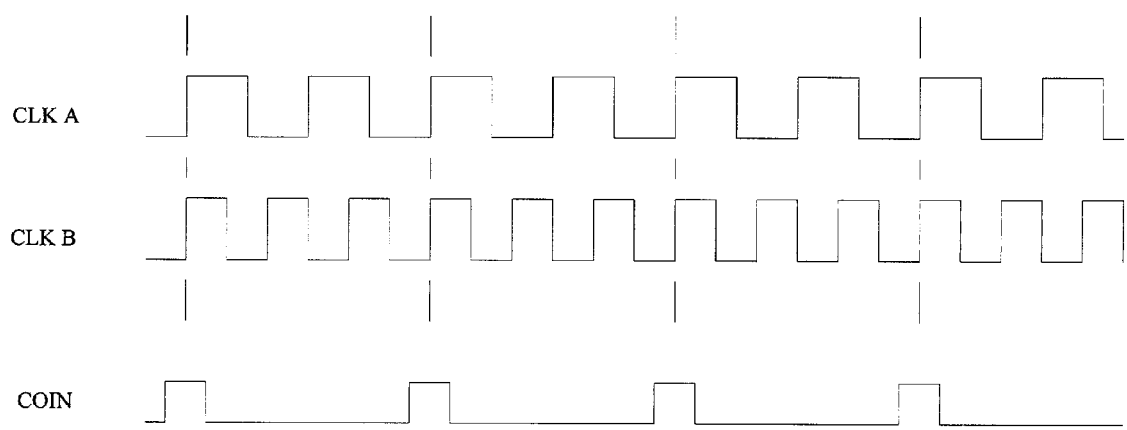
FIG. 6 is a timing diagram illustrating the coincidence points detected in FIG. 5.

A further problem arises for patgen/timing circuitry 46 on one channel card that runs at a different frequency than the patgen/timing circuitry on other channel cards. This may arise for DUTs that have pins operating at different frequencies, necessitating tester channels that can accommodate this feature. The inventors have determined that if edge alignments, or coincidence points, can be detected between the different variable-frequency clocks, then synchronous starts may be initiated. Referring now to FIGS. 5 and 6, coincidence points may be detected by using a counter circuit, as shown. The counter circuit includes a counter 60 having a prediction signal input 62 and a reference clock input 64. The counter increments the number of prediction signals up to a programmed value at 66, then generates a coincident point signal.

When DUTs have ports operate at different frequencies, the frequencies are typically related at some relatively reasonable ratio, for example, 5:13. Since the clock circuits for each pattern generator (frequency) are started at the same time, they are considered aligned at that point in time. They will come back into alignment at a fixed interval. This interval value is dictated by the frequency ratio. In the case of the 5:13 example, this interval is 5 cycles of the first frequency, and 13 cycles of the second frequency. So if we simply count the number of cycles we know when the frequencies come back in alignment. This alignment is called a "coincidence point."

The coincidence point counter counts the number of occurrences of the signal CLKPREDICT. Recall earlier that CLKPREDICT is used in the tossing circuit to indicate when a variable frequency clock edge occurs in a fixed frequency clock cycle. This same signal can also be used by the clock predict circuit to determine how many cycles of the variable frequency clock have occurred.

We can now inhibit the tossing of the sync signal (dsync) to those cycles in which the signal COIN occurs, which corresponds to cycles in which the variable frequency clock is in alignment with all other variable frequency clocks in the system. The sync signal now marks a variable frequency cycle, the beginning of which is aligned with a respectively marked cycle of every other variable frequency in the system. Once this is achieved, any desired action can be performed in the variable frequency domain, such that it occurs in all variable frequency domains at the same time, for example, starting a pattern generator.

This same concept can be expanded to any number of frequency domains. For example if a third domain was added to the previous example such that the ratio becomes 10:26:17, each domain counts out the appropriate number of cycles (clkpredict signals) to know when the coincidence points occur. At some point, the ratios may become overly complex, and the time it takes to wait for all frequencies to come back into alignment is too long to be practical.

Those skilled in the art will appreciate the many benefits and advantages afforded by the present invention. In particular, jitter effects acting on the tester signals will be minimized by the local creation of high-frequency variable clocks on the channel cards themselves. Moreover, by incorporating a sync signal, implementation of multiple pattern generators operating at the same and/or different frequencies is possible.

While the invention has been particularly shown and described with reference to the preferred embodiments thereof, it will be understood by those skilled in the art that various changes in form and detail may be made therein without departing from the spirit and scope of the invention.

What is claimed is:

1. A clock system for distributing and generating a digital clock signal for a plurality of electronic assemblies, the clock system comprising:
   a reference clock for generating a first clock signal of a first frequency;
   control circuitry for generating a sync signal, the sync signal being associated with a reference edge of the first clock signal;
   clock modules respectively disposed on the plurality of electronic assemblies, the clock modules including synthesizer circuitry for generating at least one second clock signal having one or more second frequencies, wherein at least one of the second frequencies is different from the first frequency; and
   fanout circuitry coupled to the reference clock and the clock modules to distribute the first clock signal and the sync signal.

2. The clock system according to claim 1, wherein the clock modules further comprise phase-locked-loop circuitry and wherein the synthesizer circuitry comprises a direct-digital-synthesizer having an input for receiving the first clock signal and an output coupled to the phase-locked-loop circuitry.

3. The clock system according to claim 2, wherein the synthesizer and the phase-locked-loop circuitry cooperate to generate the at least one second clock signal and at least one of the second frequencies is greater than the first frequency.

4. The clock system according to claim 1, wherein the plurality of electronic assemblies include respective pattern generators having clock inputs coupled to the outputs of the respective clock modules.

5. The clock system according to claim 1, wherein at least two of the second frequencies are different from one another.

6. A clock system for distributing and generating a digital clock signal for a plurality of electronic assemblies, the clock system comprising:
   a reference clock for generating a first clock signal of a first frequency;
   clock modules respectively disposed on the plurality of electronic assemblies, the clock modules including synthesizer circuitry for generating at least one second clock signal having one or more second frequencies, wherein at least one of the second frequencies is different from the first frequency;
   fanout circuitry coupled between the reference clock and the clock modules to distribute the first clock signal; and
   control circuitry for generating a sync signal, the sync signal being associated with a reference edge from the first clock signal, the fanout circuitry including parallel connections for distributing the sync signal with the first clock signal, and the clock modules including synchronization circuitry for aligning and starting the clock modules synchronously based on the sync signal.

7. A clock system for distributing and generating a digital clock signal for a plurality of electronic assemblies, the clock system comprising:
   a reference clock for generating a first clock signal of a first frequency;
   clock modules respectively disposed on the plurality of electronic assemblies, the clock modules including synthesizer circuitry for generating second clock signal having second frequencies, wherein at least one of the second frequencies is different from the first frequency and at least two of the second frequencies are different from one another;

pattern generators respectively disposed on the plurality of electronic assemblies, the pattern generators having clock inputs coupled to the outputs of the respective clock modules;

fanout circuitry coupled between the reference clock and the clock modules to distribute the first clock signal; and coincidence point detection circuitry for determining synchronous operation between the respective pattern generators.

8. A frequency-based semiconductor tester comprising:
a testhead comprising:
reference clock circuitry for generating a first clock signal of a first frequency,
control circuitry for generating a sync signal, the sync signal being associated with a reference edge of the first clock signal,
clock modules having synthesizer circuitry for generating at least one second clock signal having one or more second frequencies, wherein at least one of the second frequencies is different from the first frequency, and
fanout circuitry coupled to the synthesizer circuitry and the reference clock circuitry for distributing the first clock signal as a reference signal for the synthesizer circuitry and the sync signal.

9. The frequency-based semiconductor tester according to claim 8, wherein the clock modules further comprise phase-locked-loop circuitry and wherein the synthesizer circuitry comprises a direct-digital-synthesizer having an input for receiving the first clock signal and an output coupled to the phase-locked-loop circuitry.

10. The frequency-based semiconductor tester according to claim 9, wherein the synthesizer and the phase-locked-loop circuitry cooperate to generate the at least one second clock signal and at least one of the second frequencies is greater than the first frequency.

11. The frequency-based semiconductor tester according to claim 8, wherein the testhead further comprises a plurality of pattern generators having clock inputs coupled to the outputs of the respective clock modules.

12. The frequency-based semiconductor tester according to claim 8, wherein at least two of the second frequencies are different from one another.

13. A frequency-based semiconductor tester comprising:
a testhead comprising:
reference clock circuitry for generating a first clock signal of a first frequency,
clock modules having synthesizer circuitry for generating at least one second clock signal having one or more second frequencies, wherein at least one of the second frequencies is different from the first frequency,
fanout circuitry disposed between the synthesizer circuitry and the reference clock circuitry for distributing the first clock signal as a reference signal for the synthesizer circuitry, and
control circuitry for generating a sync signal, the sync signal being associated with a reference edge from the first clock signal, the fanout circuitry including parallel connections for distributing the sync signal with the first clock signal, and the clock modules including synchronization circuitry for aligning and starting the clock modules synchronously based on the sync signal.

14. A frequency-based semiconductor tester comprising:
a testhead comprising:
reference clock circuitry for generating a first clock signal of a first frequency,
clock modules having synthesizer circuitry for generating second clock signals having second frequencies, wherein at least one of the second frequencies is different from the first frequency and at least two of the second frequencies are different from one another,
fanout circuitry disposed between the synthesizer circuitry and the reference clock circuitry for distributing the first clock signal as a reference signal for the synthesizer circuitry,
pattern generators having clock inputs coupled to the outputs of the respective clock modules, and
coincidence point detection circuitry for determining synchronous operation between the respective pattern generators.

15. A method of clocking a plurality of electronic assemblies comprising:
generating a first clock signal of a first frequency;
generating a sync signal, the sync signal being associated with a reference edge of the first clock signal,
distributing the first clock signal and the sync signal to a plurality of clock modules disposed on the plurality of electronic assemblies; and
generating at least one second clock signal with the plurality of clock modules, the at least one second clock signal having one or more second frequencies wherein at least one of the second frequencies is different from the first frequency.

16. A method of starting a plurality of automated test equipment pattern generators synchronously, the pattern generators disposed on respective electronic assemblies, the method comprising:
generating a first clock signal of a first frequency;
generating a control sync signal, the sync signal associated with a reference edge of the first clock signal;
distributing the first clock signal and the sync signal to a plurality of clock modules disposed on the respective electronic assemblies, the clock modules including clock synthesizer circuitry and edge prediction circuitry;
generating at least one second clock signal on the clock modules with the respective synthesizer circuitry, the at least one second clock signal having one or more second frequencies wherein at least one of the second frequencies is different from the first frequency; and
passing the sync signal through the edge prediction circuitry to identify start times for the plurality of pattern generators.

17. The method according to claim 16, wherein at least two of the pattern generators operate at frequencies different from one another and receive the second clock signals from the respective clock modules, the method further comprising:
detecting coincidence points between the second clock signals; and
utilizing the detected coincidence points to identify starting times for the plurality of pattern generators.

18. The method according to claim 16, wherein the synthesizer circuitry includes a plurality of direct-digital-synthesizers, and the step of generating at least one second clock signal further comprises
aligning the direct-digital-synthesizers.

* * * * *